(12) United States Patent
Schmid et al.

(10) Patent No.: US 8,614,875 B2
(45) Date of Patent: Dec. 24, 2013

(54) ANCHOR GROUP FOR MONOLAYERS OF ORGANIC COMPOUNDS ON METAL AND COMPONENT PRODUCED THEREWITH BY MEANS OF ORGANIC ELECTRONICS

(75) Inventors: Günter Schmid, Hemhofen (DE); Dan Taroata, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 251 days.

(21) Appl. No.: 12/998,157

(22) PCT Filed: Sep. 2, 2009

(86) PCT No.: PCT/EP2009/061323
§ 371 (c)(1),
(2), (4) Date: Mar. 23, 2011

(87) PCT Pub. No.: WO2010/034597
PCT Pub. Date: Apr. 1, 2010

(65) Prior Publication Data
US 2011/0170227 A1    Jul. 14, 2011

(30) Foreign Application Priority Data

Sep. 23, 2008  (DE) .................. 10 2008 048 446
Apr. 7, 2009   (DE) .................. 10 2009 016 659

(51) Int. Cl.
*H01G 4/06*    (2006.01)
*H01G 4/20*    (2006.01)
(52) U.S. Cl.
USPC ......................................... 361/313; 361/311
(58) Field of Classification Search
USPC .................................. 361/311, 313
See application file for complete search history.

(56) References Cited

U.S. PATENT DOCUMENTS

| 5,124,022 A  * | 6/1992 | Evans et al. ................ 205/175 |
| 7,202,547 B2 * | 4/2007 | Klauk et al. ................ 257/532 |
| 2005/0189536 A1 | 9/2005 | Zschieschang et al. |
| 2006/0094198 A1* | 5/2006 | Klauk et al. ................ 438/382 |
| 2007/0099338 A1 | 5/2007 | Klauk et al. |
| 2007/0114516 A1 | 5/2007 | Napierala |
| 2008/0131709 A1 | 6/2008 | Hanson et al. |

FOREIGN PATENT DOCUMENTS

| DE | 10 2004 005 082 | 8/2005 |
| DE | 10 2004 009 600 | 9/2005 |
| DE | 10 2004 057 531 | 6/2006 |
| DE | 10 2008 048 446.6 | 9/2008 |
| DE | 10 2009 016 659.9 | 4/2009 |
| EP | PCT/EP2009/061323 | 9/2009 |

OTHER PUBLICATIONS

John G. Van Alsten, "Self-Assembled Monolayers on Engineering Metals: Structure, Derivatization, and Utility," Langmuir, vol. 15, No. 22, Aug. 26, 1999, pp. 7605-7614.
International Search Report for PCT/EP2009/061323, mailed on Mar. 30, 2010.

* cited by examiner

*Primary Examiner* — David M Sinclair
(74) *Attorney, Agent, or Firm* — Staas & Halsey

(57) ABSTRACT

An anchor group anchors organic dielectric compounds used in the production of organically based capacitors. The capacitors referred to are those that can be produced in a parallel process on a prepeg or other common printed circuit board substrate without additional metallization on copper. The prefabricated capacitor layer can then be built into the printed circuit board, thereby gaining on space and cost for the surface of the printed circuit board.

20 Claims, 12 Drawing Sheets

ANCHOR GROUP FOR MONOLAYERS OF ORGANIC COMPOUNDS ON METAL AND COMPONENT PRODUCED THEREWITH BY MEANS OF ORGANIC ELECTRONICS

CROSS REFERENCE TO RELATED APPLICATIONS

This application is based on and hereby claims priority to International Application No. PCT/EP2009/061323 filed on Sep. 2, 2009 and German Application Nos. 10 2008 048 446.6 filed on Sep. 23, 2008 and 10 2009 016 659.9 filed on Apr. 7, 2009, the contents of which are hereby incorporated by reference.

BACKGROUND

Organic dielectric or conductive compounds on metal electrodes, especially on copper layers or copper-containing layers, are used, for example, in the production of organic-based electronic components.

For the purposes of miniaturization, it is particularly advantageous to use ultrathin layers, especially monolayers, with precisely adjusted functionality in electronic components, especially also in organic electronic components. In order that molecules in monolayers self-organize and hence exhibit maximum functionality and function density, it is advisable to fix them on the particular electrodes by head or anchor groups, which automatically results in an alignment of the linker groups, i.e. of the groups connecting the two ends. The attachment to the substrate takes place spontaneously provided that the substrate has been prepared appropriately.

The specific functionality is determined by the linkers and head groups. The anchor determines the self-organization.

For this purpose, DE 10 2004 005 082, for example, discloses an aromatic head group which has $\pi$-$\pi$ interaction and whose introduction is chemically complex, which binds a self-assembled dielectric layer to an electrode. According to DE 10 2004 005 082, the attachment to the counterelectrode used, as what is called the anchor group of the organic dielectric compound, which is usable as a monolayer in a capacitor, is a silane compound which can be attached to the electrode via an oxide layer formed from a non-copper oxide.

A disadvantage of the known related art is that the electrode surface, i.e., for example, the copper surface, preferably has to be functionalized with aluminum or titanium for application of the self-assembled monolayer, the functionalization then providing an oxidic surface for attachment. However, such a functionalization step for the electrode surface is very costly, since non-copper metals first have to be applied and structured. An additional factor is that the electrode surfaces, if they are processed by conventional methods on conventional blanks or circuit boards or prepregs generally have a surface roughness in the region of approx. 4 µm. This roughness limits the mechanical stability of a surface coated with a monolayer, since the gaps at the particle boundaries are not necessarily fully covered, or high field strengths arise at substrate tips. The height of the monolayer, generally approx. 2 to 5 nm, and not more than 20 nm, does not planarize the roughness due to the conforming deposition.

SUMMARY

It is therefore one potential object to overcome the disadvantages of the related art and more particularly to provide an anchor group for a self-assembled monolayer (SAM), which enables application of the SAM coating to a copper electrode produced and prepared by conventional methods.

Accordingly, the inventors propose an organic compound for a self-assembled monolayer on a copper layer or copper-containing layer, comprising at least one anchor group for a first electrode layer, a linker group and a head group for attachment to the next layers, wherein the anchor group contains at least one phosphonic acid and/or a phosphonic acid derivative. The head group may be of a specific type, or else be dispensed with. In addition, the inventors propose a component which is based on organic electronics and is integrated into a circuit board, a prepreg or a blank, wherein the blank, circuit board or prepreg serves as a substrate on which an organic compound for a self-assembled monolayer according to the subject matter of the proposals (see above) is formed.

An "organic compound for a self-assembled monolayer" refers above to compounds which, due to a particular anchor group, are aligned in the layer such that a majority of the molecules are present with parallel and/or identical alignment in the layer. For example, DE 10 2004 005082 describes corresponding organic compounds which can form monolayers in the dielectric layer of a component based on organic electronics. The organic compounds usable differ from these at least by a different head and/or anchor group. In addition, many commercially available materials can be employed and used to produce impervious monolayers.

In an advantageous embodiment, a component based on organic electronics is formed directly on a blank, for example a copper blank produced by customary production methods, without having been functionalized by a further metal or smoothed by specific processes. The metal layer to which the anchor group is applied is accordingly a copper layer or copper-containing layer, the proportion of copper in the layer being preferably more than 10%, especially preferably more than 40% and most preferably more than 70%, measured in mole percent.

There is no need for a separate preparation of the substrate surface. The preparation includes only cleaning steps and not the application of additional materials, as is customary according to the art.

A useful component based on organic electronics is especially a capacitor. In addition, it is possible by virtue of the inventors' proposals to improve, for example, organic field-effect transistors, the gate dielectric for organic field-effect transistors being suitable for direct integration into the circuit board, or organic light-emitting diodes (OLEDs), the electrodes for the OLEDs being deposited on the thin insulation, especially since the copper layer for top-emitting OLEDs is hermetic. The term "OLED" also includes light-emitting electrochemical cells (LEECs).

Finally, analogously to the structure for the OLEDs, the layer sequence can also be used for solar cells, and so possible components based on organic electronics are, as well as capacitors, at least also organic field-effect transistors, OLEDs and organic solar cells. In principle, the proposals are suitable for all kinds of organic insulating intermediate layers. The layer can also be applied only for a certain time, i.e. temporarily. Applied in a temporary or permanent manner to copper or copper alloys, the layer is also suitable as a printable "photoresist substitute", or for production of regions of different hydrophobicity.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
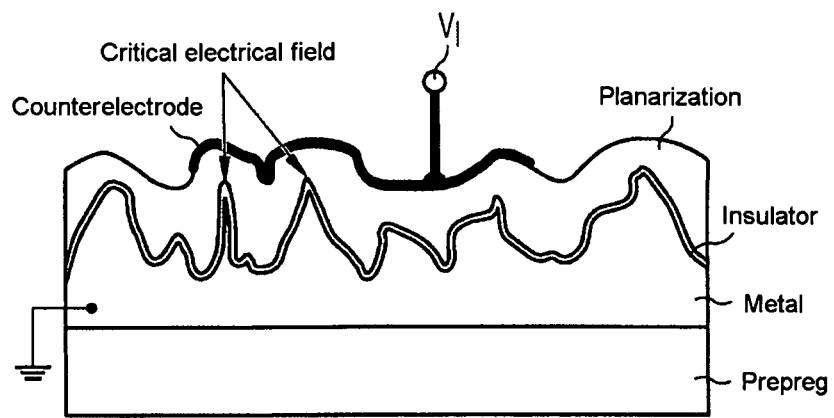
FIG. 1 shows such a structure using the example of a capacitor.

Reference will now be made in detail to the preferred embodiments of the present invention, examples of which are illustrated in the accompanying drawings, wherein like reference numerals refer to like elements throughout.

In particular, it is possible to structure a component inexpensively and directly on a pickled copper surface. FIG. 1 shows such a structure using the example of a capacitor.

Figure 2:
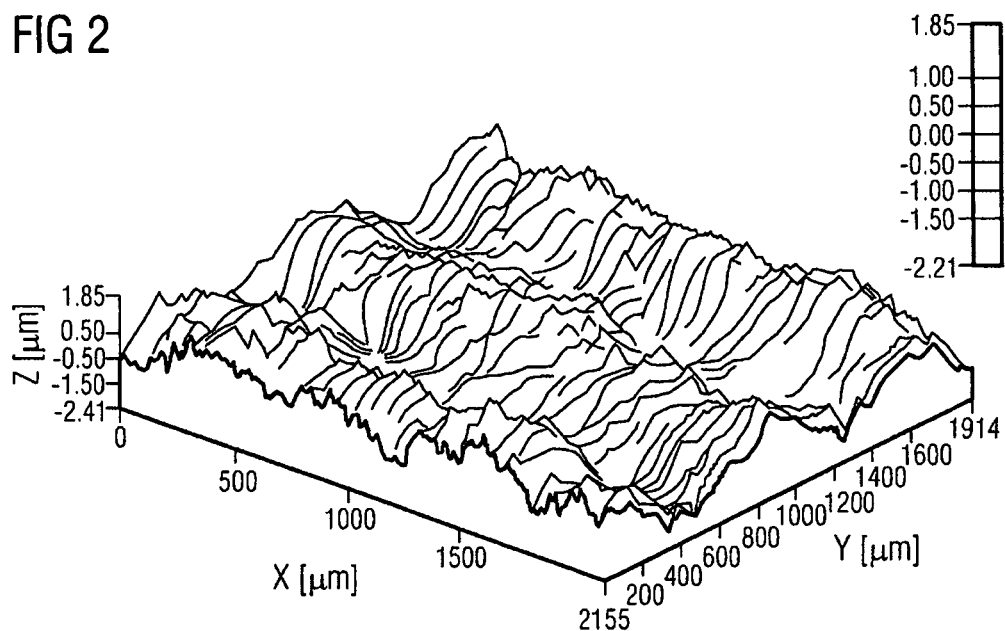
FIG. 2 visualizes the roughness of a pickled circuit board substrate.

The base material used for the capacitor is a copper blank pickled by customary methods with an applied layer of approx. 5-30 μm of copper plate and a roughness in the μm range. The pickling can be effected as usual by degreasing with organic solvents and then etching the surface with peroxodisulfates and sulfuric acid. FIG. 2 visualizes the roughness of a pickled circuit board substrate.

The copper surface can be additionally cleaned, as usual in electroplating technology, by cathodic means. For this purpose, the substrate is connected as the cathode in dilute sodium carbonate solution and cleaned by the hydrogen which forms at a current flow of 10-100 mA/cm$^2$.

As a result of the pickling, the contact angle with respect to water is less than 5°. As a result, the copper surface becomes very hydrophilic. To prevent the oxidation of the copper, and as a primer for the subsequent thin polymer deposition which is planarized only locally, a monolayer of an organic phosphonic acid is deposited immediately thereafter. The phosphonic acid anchor group has been found to be highly suitable especially for copper, whereas DE10 2004 005082 B4 worked preferably with silanes (working example), and the copper surface preferably has to be functionalized with aluminum or titanium for deposition. Such a functionalization step for the copper surface is dispensed with completely in the component presented.

Preference is given to the long-chain phosphonic acids, such as decyl- to octadecylphosphonic acid, in general terms $CH_3$—$(CH_2)_n$—$PO(OCH)_2$, where n=8-25, preferably n=18. The molecule chain may also take the form of a polyether chain (—O—$CH_2$—$CH_2$—O—)$_m$ where m is from 1 to 20, preferably from 2 to 10. The contact angle with respect to water increases after deposition of an octadecylphosphonic acid to >130° for alkylphosphonic acids, and is thus an indication of the quality of the deposition. The alkyl chains may also be fully or partly fluorinated.

Alternatively, the deposition can also be effected via the phosphonic esters or salts thereof, or other derivatives such as amines etc. The salts can be obtained directly in solution by adding smaller or equivalent amounts of alkali (NaOH, KOH, ammonia or ammonium hydroxides).

The head group used in the case of a support polymer may be singly branched or unbranched alkyl groups, or alkenyl groups suitable for further reactions (i.e. crosslinking). To improve the attachment of the monolayer to the support polymer, the head group may be a fluorine, nitrile, amino, ester, aldehyde, epoxy or acid function. In the case of a fluorination, the head group could comprise —$CF_3$, —$CHF_2$, —$CH_2F$.

To increase the mechanical stability, in an advantageous embodiment, a support polymer, i.e. a thin polymer layer, is applied to the monolayer for stabilization and/or for the local planarization of the capacitor or component. Typically, an effective polymer layer thickness of approx. 550-600 nm is obtained for an integration density of 50 pF/mm$^2$ at a dielectric constant of 3.17, whereas an effective layer thickness of 180-200 nm is obtained for an integration density of 150 pF/mm$^2$. More polymer is applied in the depressions, while a thinner polymer film is present at the peaks. Compared to the approach presented by 3M, the component thickness of 14 μm can be lowered by a factor of 70 while simultaneously increasing the capacitance by a factor of 15.

The leakage current characteristics of the capacitor disclosed here are determined almost exclusively by the self-assembled monolayer. It was therefore also measured (see FIG. 24) that the resistances have profiles independent of the stabilization polymer thickness because the essential contribution to the ohmic overall resistance of the capacitor to direct current is made by the self-assembled monolayer. It is therefore possible to planarize using any desired polymers, provided that they are compatible with the circuit board processes.

For example, polyhydroxystyrene crosslinked by melamine-co-formaldehyde was used. A good planarizing action was achieved when the polyhydroxystyrene had a molar mass in the range from 500 to 100 000, especially from 3500 to 50 000, especially preferably of 8000. The crosslinking was preferably performed within the temperature range between 180° C.-230° C. After the crosslinking, the polymer layer for mechanical stabilization is no longer attacked by solvents.

In addition to the novolac-like polymers, it is also possible for resins based on epoxides, acrylates, urethanes or carbonates to find use as support polymers. Further polymers: polyesters, polyamides, polyimides, polybenzoxazoles, polyvinylidene difluoride (teflon-like materials in general), polyvinyl compounds (carbazoles, alcohols and esters thereof). Copolymers or block copolymers such as ABS are likewise suitable. The molar mass of the polymers may be in the range from 1000 to 1 000 000.

The locally planarized polymer layers may be applied as follows:

a. from solution. For this purpose, 1-50%, preferably 5-20%, of the polymer with or without crosslinker is dissolved in an organic solvent (PGMEA=propylene glycol monoethyl ether acetate, tetrahydrofuran, dioxane, chlorobenzene, diethylene glycol diethyl ether, diethylene glycol monoethyl ether, gamma-butyrolactone, N-methylpyrrolidinone, ethoxyethanol, xylene, toluene, etc), and applied in appropriate thickness by spin-coating, printing (screen printing, inkjet printing, spraying, etc). Thereafter, the solvent is evaporated by a heat treatment step, which leaves the dust-dry or cured polymer layer. The polymers can be crosslinked thermally or photochemically. Crosslinking is optional. For polyvinyl alcohol, for example, water is also suitable as a solvent. Possible crosslinkers are photoacids.

b. In the case of acrylates and epoxides, the monomers or oligo compounds can be applied by spin-coating or printing (see above) and then crosslinked thermally or photochemically to give the dielectric.

The outer electrodes used for the capacitor may be any metal or alloy thereof, or conductive metallic printing pastes. Likewise suitable are organic conductors, such as PEDOT (polystyrenesulfonic acid-doped polydiethoxythiophene) or PANI (camphorsulfonic acid-doped polyaniline). Particular preference is given, however, to the metals used in the circuit board industry: copper, aluminum, nickel, gold and silver or alloys thereof. Metal counterelectrodes applied over the full area can be structured thereafter by etching and mechanical ablation processes (laser) known to those skilled in the art. When several capacitors are provided with a common counterelectrode, the counterelectrode can also be deposited from the gas phase by shadowmasks (see working examples).

The counterelectrodes can also be applied by electroless metallization, after local or full-area seeding. In principle, it is possible to use all processes in the circuit board industry, since the dielectric after crosslinking is compatible with the customary media in the circuit board industry.

The head group normally stabilizes the monolayer itself. In general, the head group brings about the attachment of the SAMs to the opposite layer. Attachment is understood here to mean any form of the bond, especially a chemical bond, which can range from a covalent double bond through ionic bonds up to simple van der Waals bonds.

The head group does not come into contact with the electrode in a capacitor with a stabilizing polymer outer layer, as envisaged in an advantageous embodiment. Only the polymer layer comes into contact with the outer electrode. The polymer layer can be functionalized by the known processes, for example by metal application by vapor deposition or sputtering, printing with metal pastes, etc. It has been found experimentally that it is then also possible to dispense with an inconvenient head group. The interaction of the individual chains is in principle sufficient for the stabilization of the self-assembled monolayer, but a head group can improve the electrical properties even in the case of use of a polymer outer layer to stabilize the monolayer.

The envisaged structure of an electrode layer with a subsequent insulator layer can of course be used advantageously not only in a capacitor, but is in principle also suitable for the following applications:

as

1. A gate dielectric for organic field-effect transistors for direct integration into the circuit board.
2. A substrate for top-emitting OLED (the copper layer is hermetic). On the thin insulation, it is then possible to deposit the electrodes for the OLED.
3. Analogously to the structure for the OLEDs, the layer sequence is also suitable for solar cells.

Example 1

For the test setup, an FR4 blank laminated with 30 μm of copper is cut to a size of 50×50 m². This is first freed of grease with acetone and isopropanol. A commercial photoresist (TMSR8900) is spun on at 6000 rpm for 20 s and dried on a hotplate at 110° C. for 60 s. The photoresist is exposed for 7 s with UV light of a wavelength of 365 nm, and developed in aqueous alkaline developer for 60 s.

The photostructuring is followed by pickling in a 5% ammonium peroxodisulfate solution at 40° C. for 3 min. After rinsing with water and isopropanol, the blank is placed into a solution of octadecylphosphonic acid (0.2-0.25 g) in isopropanol (100 ml). After 12 hours, the blank is rinsed with isopropanol and dried in a nitrogen stream at 100° C. for 1 min.

Figure 3:
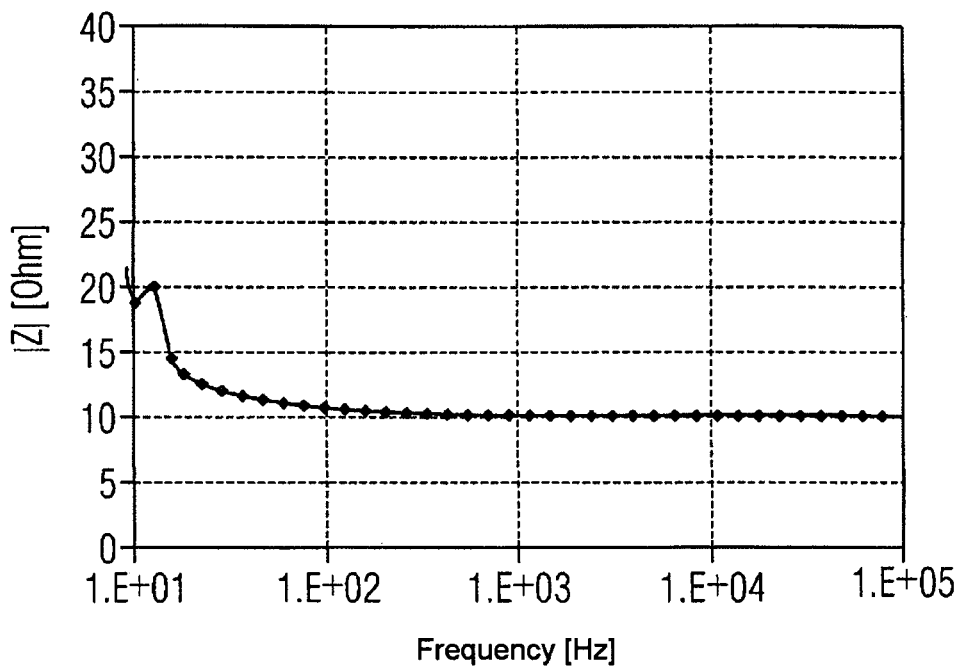
FIGS. 3 and 4 show the electrical characteristics (value approx. 10Ω and phase angle of the impedance approx. 0°) assuming all capacitors are short-circuited.
Figure 4:
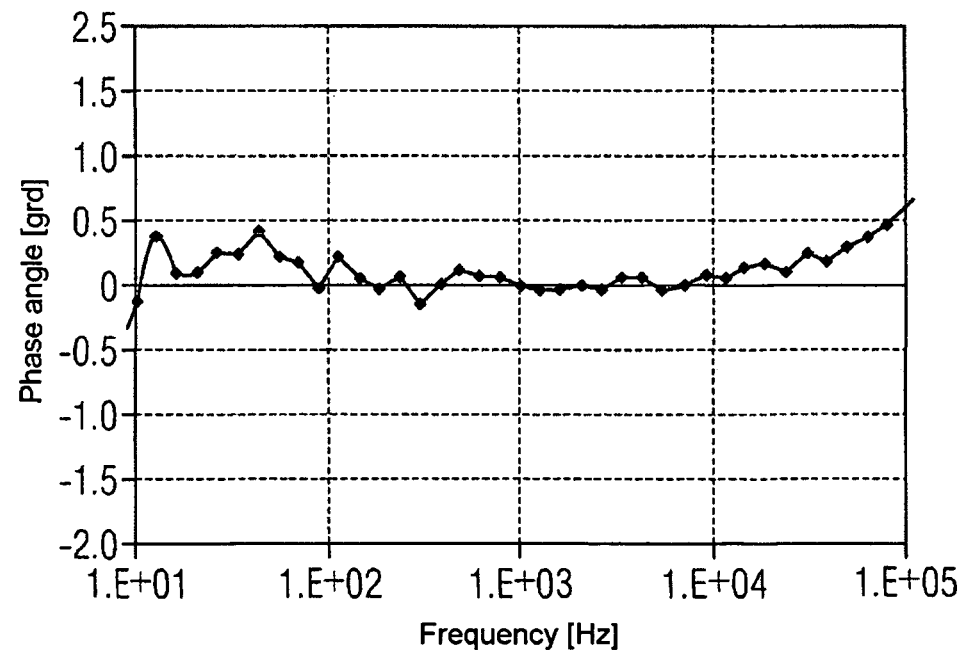

After the pickling, the contact angle with respect to water is 1° to 4°. After the deposition of the octadecylphosphonic acid, the contact angle is 135°, which suggests excellent coverage of the copper layer. Thereafter, 100 nm of aluminum is applied by vapor deposition through a shadowmask as the counterelectrode. For example, a processed capacitance specimen was thus produced on an FR4 circuit board. The electrical characteristics (value approx. 10Ω and phase angle of the impedance approx. 0°) in FIGS. 3 and 4 show that all capacitors are short-circuited. An ideal capacitor would have a volume resistance of infinity. 10 ohms is a short circuit, i.e. the capacitor does not work. It is found that, for standard circuit boards with a roughness in the μm range without Ti or Al pretreatment or without the presence of an aromatic head group on the primer, the process from DE 10 2004 005082 is not suitable for formation of capacitors in high yield.

Further examples show that high-capacitance capacitors can be formed directly on copper with a primer even without a head group with π-π interaction, the introduction of which is chemically complex. The anchor group, i.e. the phosphonic acid group, resides directly on the copper surface.

Example 2

Integration Density 50 pF/mm²

Analogously to example 1, a copper-laminated FR4 circuit board or a prepreg is coated with the primer octadecylphosphonic acid or hexadecylphosphonic acid. A solution of 0.8 g of polyvinyl-phenol (molar mass 8000) containing 0.2 g of polymelamine-co-formaldehyde crosslinker is dissolved in 5.67 g of propylene glycol monomethyl ether acetate and spun on at 2500 rpm for 40 s, and predried on a hotplate at 100° C. for 60 s. In a vacuum oven, the novolac-like polymer is cured with the formaldehyde crosslinker at 180° C. to 230° C. Thereafter, analogously to example 1, aluminum electrodes are applied by vapor deposition (base pressure $1*10^{-6}$ mbar). Other integration densities can be obtained by adjusting the spin speed.

Figure 5:
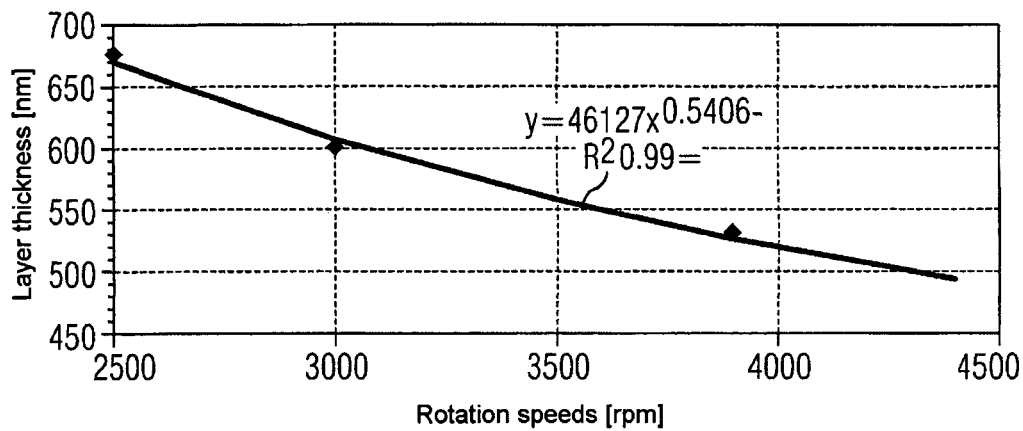
FIG. 5 shows a spin curve, with the effective mean layer thickness of the polymer layer shown as a function of the spin speed.
Figure 6:
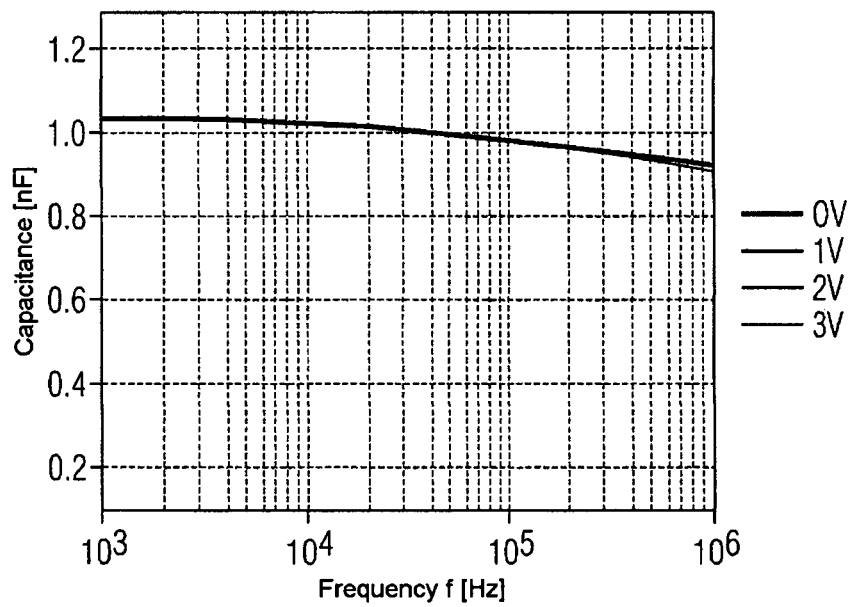
FIG. 6 shows the dependence of the capacitance on the frequency.
Figure 7:
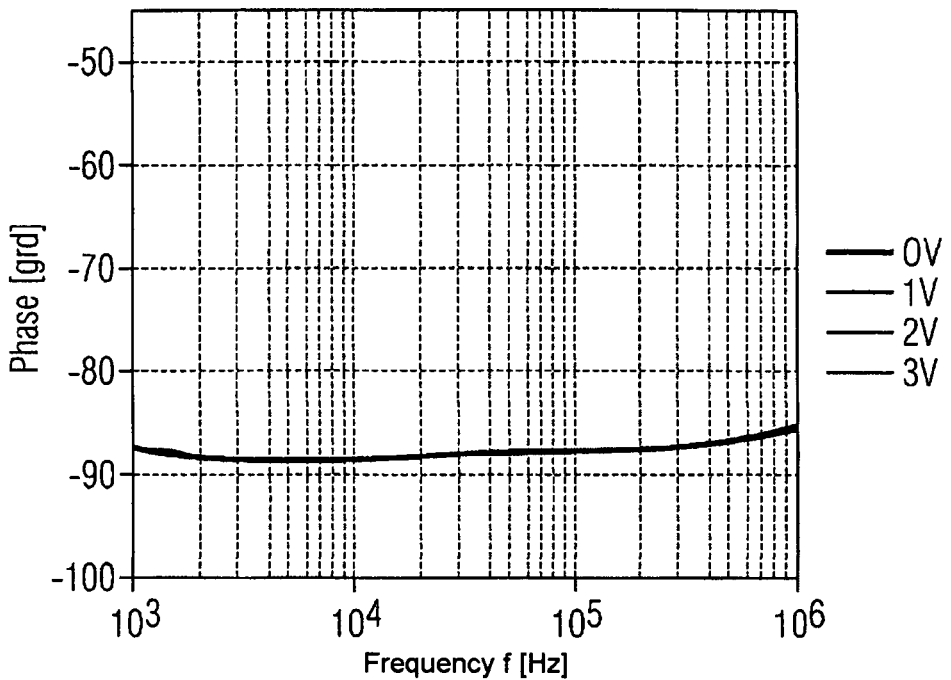
FIG. 7 shows the dependence of the phase of the impedance on the frequency.

FIG. 5 shows a spin curve, with the effective mean layer thickness of the polymer layer shown as a function of the spin speed.

Figure 8:
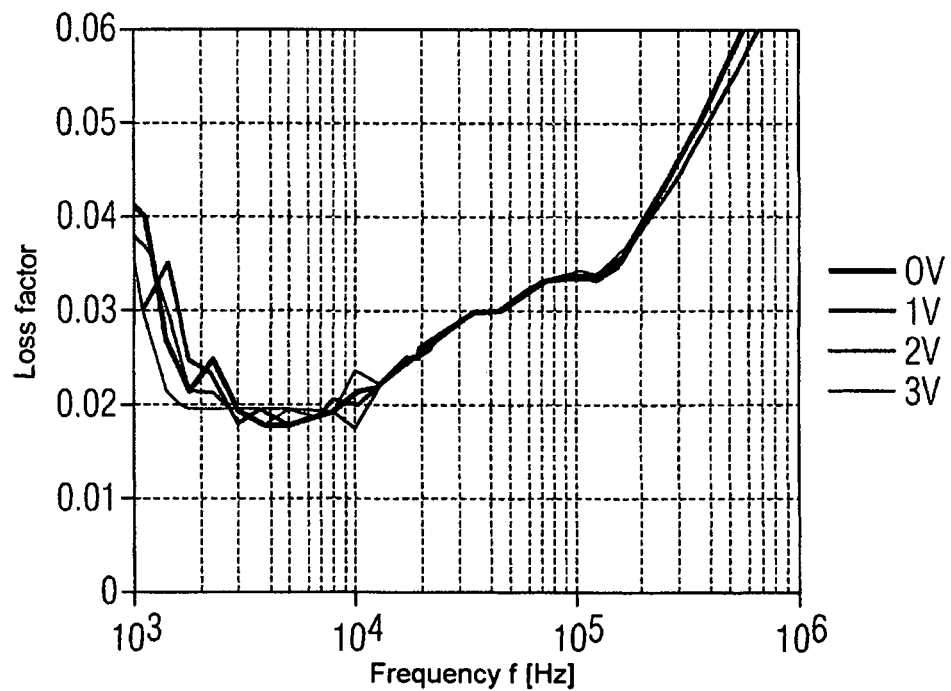
FIG. 8 shows the dependence of the phase of the loss factor on the frequency.
Figure 9:
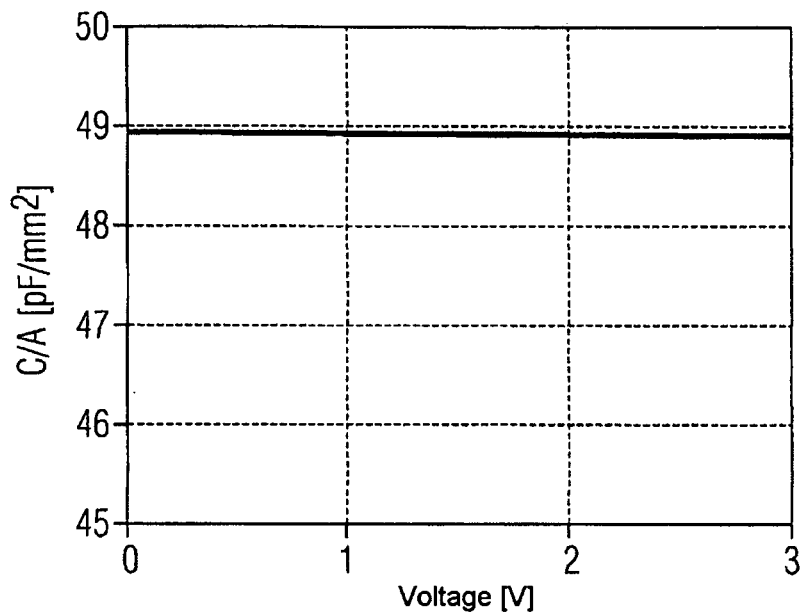
FIG. 9 shows the dependence of integration density 49 pF/mm$^2$ on the direct current voltage applied for a capacitor having a nominal integration density of 49 pF/mm$^2$.
Figure 10:
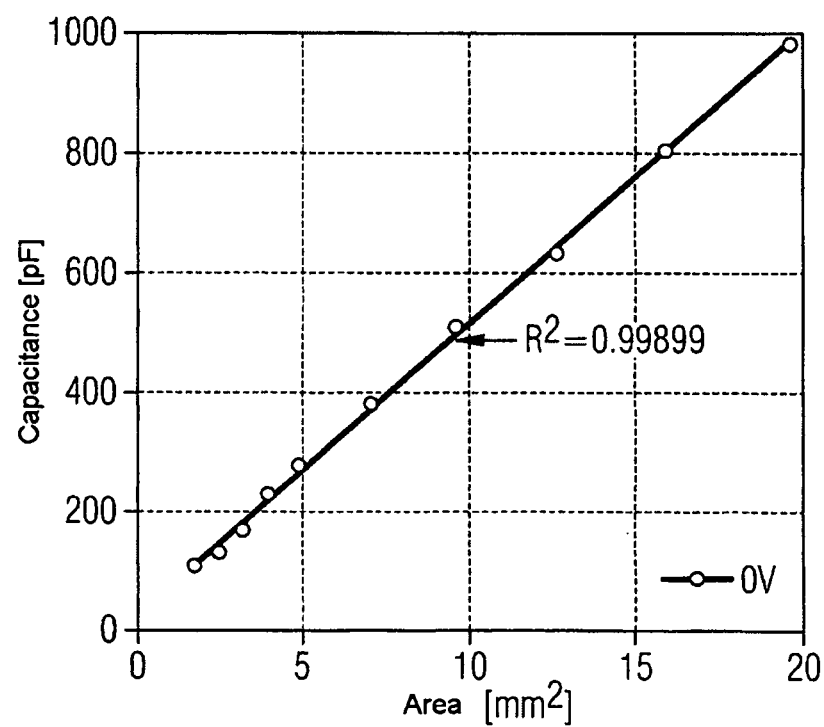
FIGS. 10 to 13 show the dependence of the capacitance on the electrode area at 0 V to 3 V at 50 pF/mm$^2$.
Figure 11:
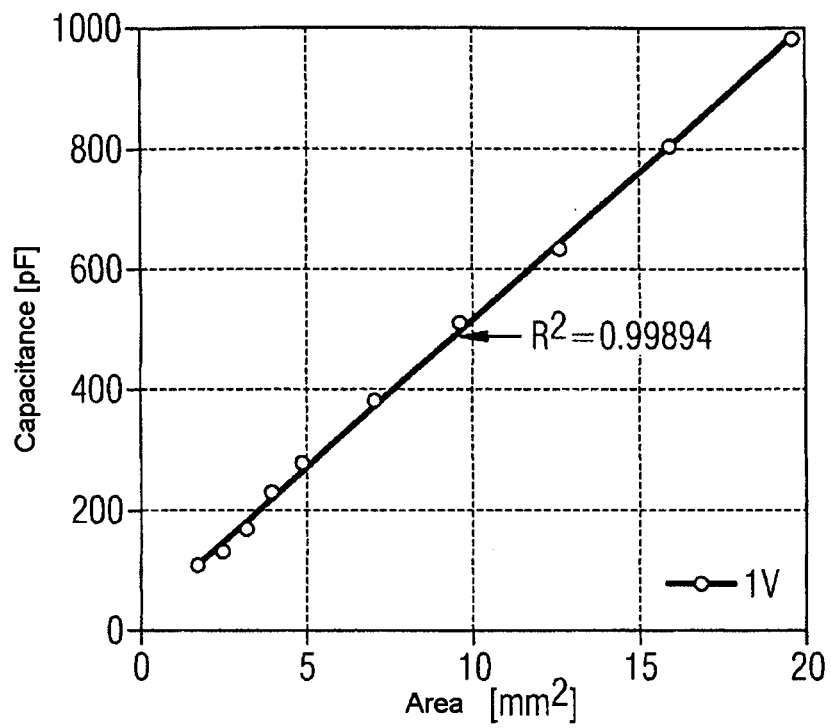
Figure 12:
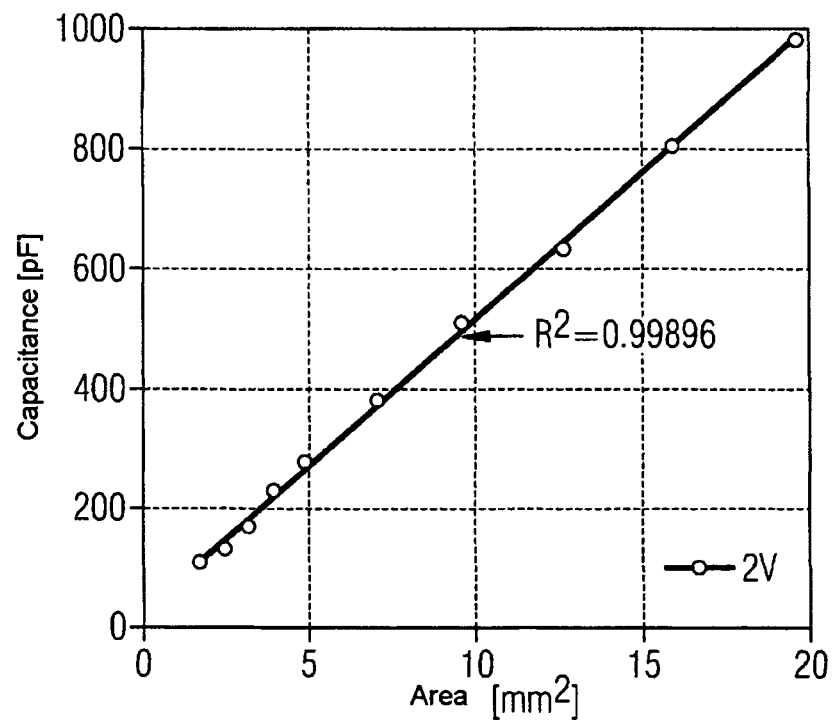
Figure 13:
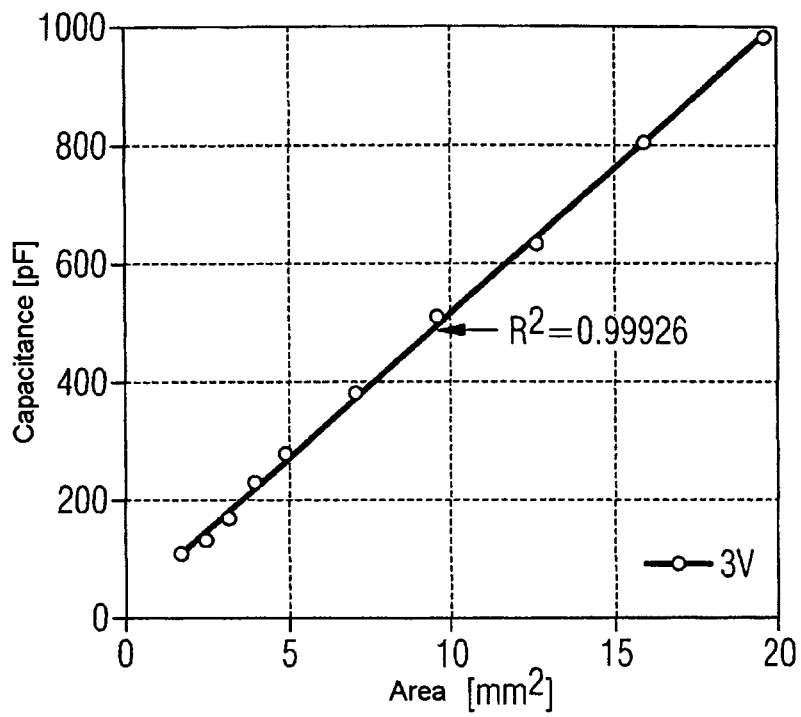

FIGS. 6 to 9 show the dependence of the capacitance (6), of the phase of the impedance (7) and of the loss factor (8) of an actual capacitor with integration density 49 pF/mm$^2$ (9) on the frequency and direct current voltage applied. The electrical characteristics are shown in FIGS. 6 to 9. The dependence of the capacitance measured on the frequency is low, which demonstrates the quality of the capacitor presented. The phase of the impedance of the actual capacitor assumes values between −89° and −87° in the frequency range shown. The loss factor was in the region of 0.0x and is, as shown in FIG. 8, likewise virtually independent of the frequency. Moreover, there is no evident dependence of the parameters shown in FIGS. 6 to 9 on the direct current voltage applied. In the measurements, bias voltages between 0 V and 3 V were set, while the amplitude of the superimposed alternating current, the frequency of which was varied between 1 kHz and 1 MHz, was 0.1 V.

FIGS. 10 to 13 show the dependence of the capacitance on the electrode area. The strictly linear behavior shows that large-area capacitances (20 mm$^2$=1 nF) can also be produced. The yield of functioning substrates is 100% on a substrate according to example 1. The quality of the capacitors is thus comparable to discrete SMD components (loss factor of 0.035 in commercial ceramic SMD capacitors).

FIGS. 10 to 13 show the dependence of the capacitance on the electrode area at 0 V to 3 V at 50 pF/mm$^2$.

Figure 14:
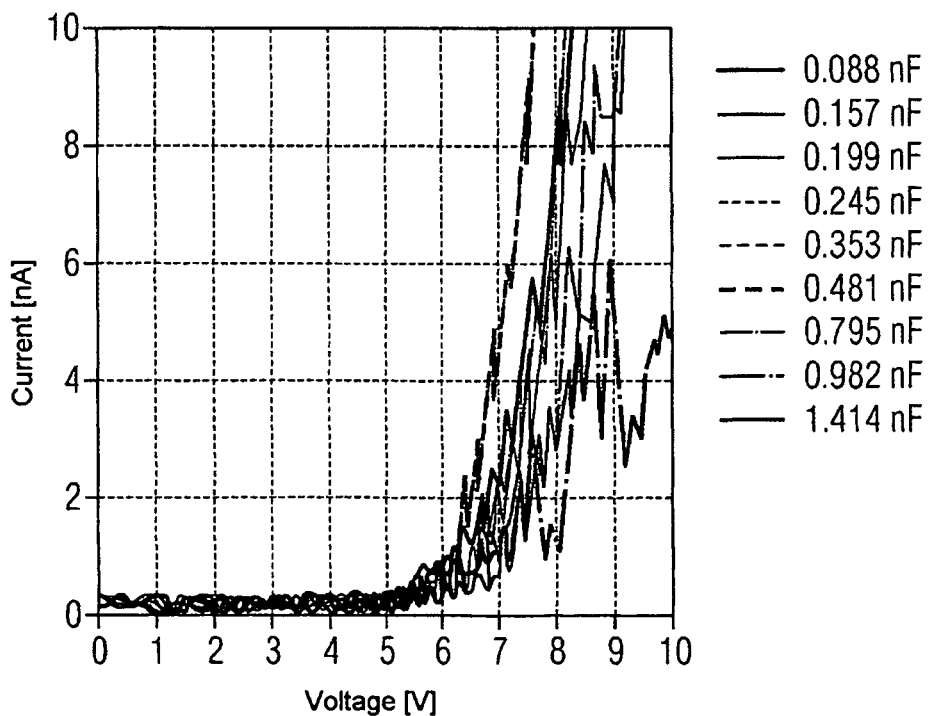
FIG. 14 shows the leakage current measurement for a capacitor with an integration density of 50 pF/mm$^2$, for round electrodes.
Figure 15:
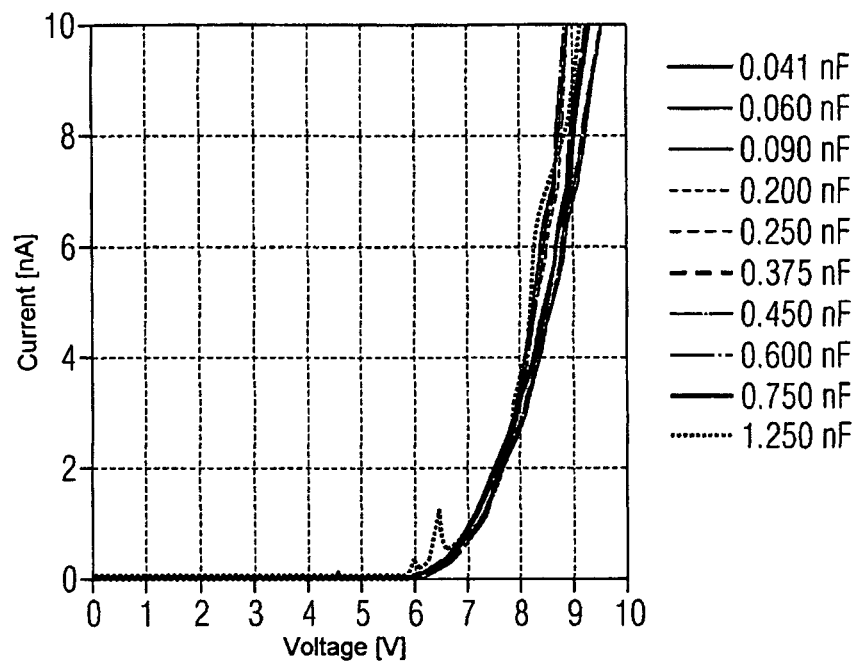
FIG. 15 shows the leakage current measurement for a capacitor with an integration density of 50 pF/mm$^2$, for angular electrodes.

FIGS. 14 and 15 show the leakage current measurement for a capacitor with an integration density of 50 pF/mm$^2$ and (14) round or (15) angular electrodes.

FIGS. 14 and 15 show the leakage current measured as a function of the direct current voltage applied in capacitors with different electrode areas. The measurement curves do not show an actual breakthrough, but merely an increased leakage current from 7 V DC (2 nA to 4 nA), but this is small compared to SMD components. Moreover, there is no evident dependence of the currents measured in FIGS. 14 and 15 on the electrode shape.

Figure 16:
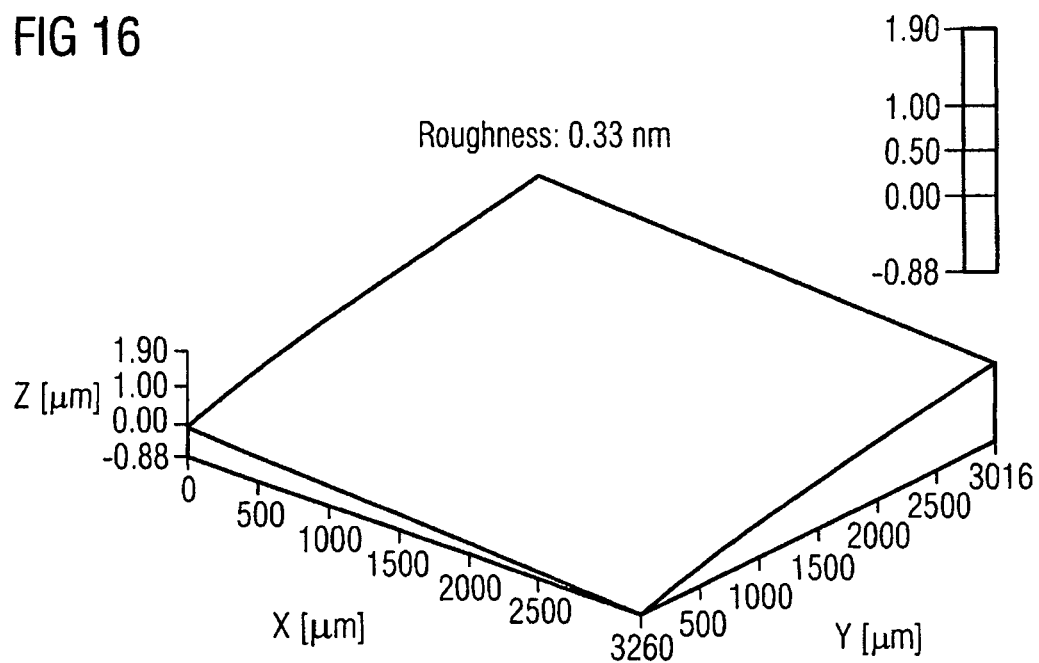
FIG. 16 shows a roughness within the range from 0.20 nm to 0.33 nm.

The dielectric constant of the crosslinked polymer was determined as follows. Owing to the excessive roughness of the FR4 substrate (see FIG. 2), an exact determination of the dielectric thickness is impossible. For this reason, capacitors were produced on a substrate with minimum roughness. For this purpose, glass substrates were used as carriers. With the aid of a profilometer, the profile of such a substrate was first examined. FIG. 16 shows the roughness measurement on a glass sample.

Figure 17:
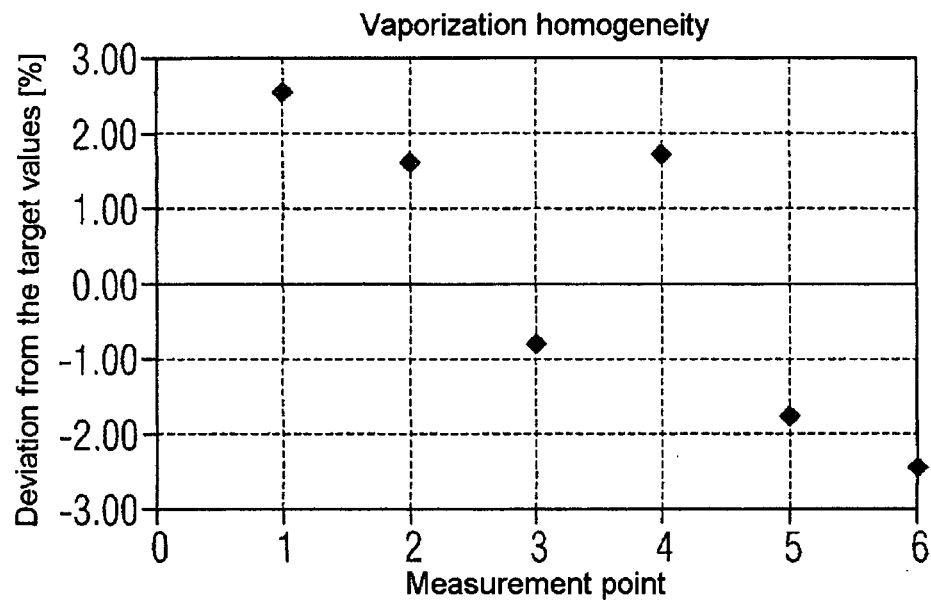
FIG. 17 shows the homogeneity of vapor-deposited layers.

As shown in FIG. 16, the roughness is within the range from 0.20 nm to 0.33 nm. For the further characterization of the capacitors, both electrodes were applied to the substrate by a vapor deposition process. The homogeneity of the vapor-deposited layers is shown in FIG. 17.

A 100 nm-thick copper layer was applied by vapor deposition. The corners of the glass sample were masked with Kapton tape as a shadowmask. After the vapor deposition process, the Kapton tape was removed and the layer thickness was measured with the aid of a profilometer.

After the SAM had been vapor-deposited onto the substrate, the polymer layer was applied by spin-coating (20% by weight polymer solution, spin speed 2500 rpm). Before this processing step, the sample was provided again with Kapton tape at one corner. This created a defined level at which the thickness of the dielectric can be determined. The subsequent layer thickness measurement gave an effective mean thickness of 573 nm. With the aid of another vapor deposition step, the upper electrode of the capacitors was produced.

By plotting the capacitance measured as a function of the product of electrode area, dielectric constant for vacuum and the reciprocal of the distance between the two capacitor plates, it is possible to determine the relative dielectric constant graphically.

Figure 18:
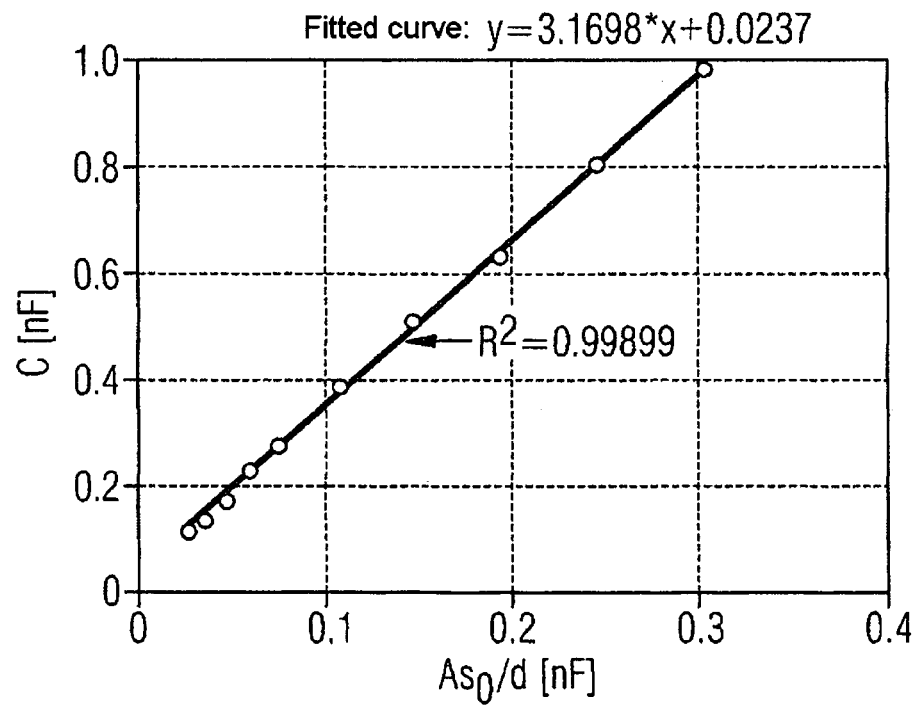
FIG. 18 shows the measurement to determine the relative dielectric constants.

FIG. 18 shows the measurement to determine the relative dielectric constants.

For the relative dielectric constants, the measurements described, taking account of the measurement uncertainties, were used to calculate a value of 3.17±0.08.

Example 3

Integration Density 150 pF/mm$^2$

Analogously to example 1, a copper-laminated FR4 circuit board or a prepreg was coated with the primer octadecylphosphonic acid or hexadecylphosphonic acid. In order to preserve the adhesive properties of the prepreg, a photochemically crosslinking epoxy resin is used. The photocrosslinking is performed, for example, through a shadowmask. After the uncrosslinked regions have been rinsed off, there remain defined dielectric regions. Contact sites are exposed.

In the case of the circuit board, a solution of 1 g of polyvinylphenol (molar mass 8000) containing 0.25 g of polymelamine-co-formaldehyde crosslinker is dissolved in 8.75 g of propylene glycol monomethyl ether acetate and spun on at 2000 rpm for 40 s, and predried on a hotplate at 100° C. for 60 s. In a vacuum oven, the novolac-like polymer is cured with the formaldehyde crosslinker. Thereafter, analogously to example 1, aluminum electrodes are applied by vapor deposition (base pressure $1*10^{-6}$ mbar).

In another embodiment, the counterelectrode may be a copper electrode, which is applied, for example, by sputtering.

The electrical characteristics of the capacitors with an integration density of 150 pF/mm$^2$ are shown in FIGS. 19 to 22.

FIGS. 19 to 22 show the dependence of the capacitance (19), of the phase (20) and of the loss factor (21) on the frequency and leakage current characteristics (22) of the capacitors with an integration density of 150 pF/mm$^2$ as a function of the capacitance value (or electrode area).

Figure 19:
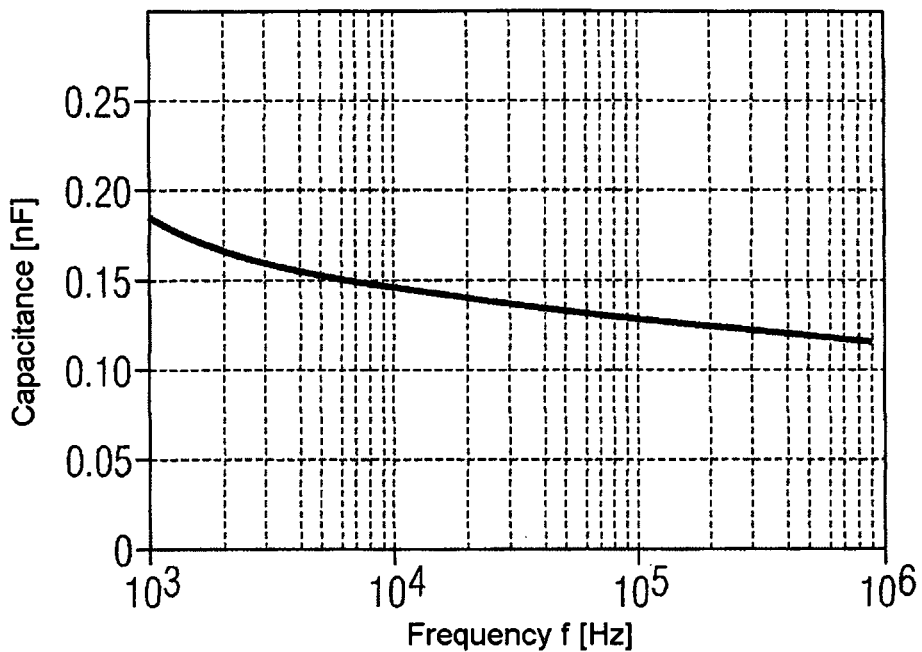
FIG. 19 shows the dependence of the capacitance on the frequency of capacitors with an integration density of 150 pF/mm$^2$
Figure 20:
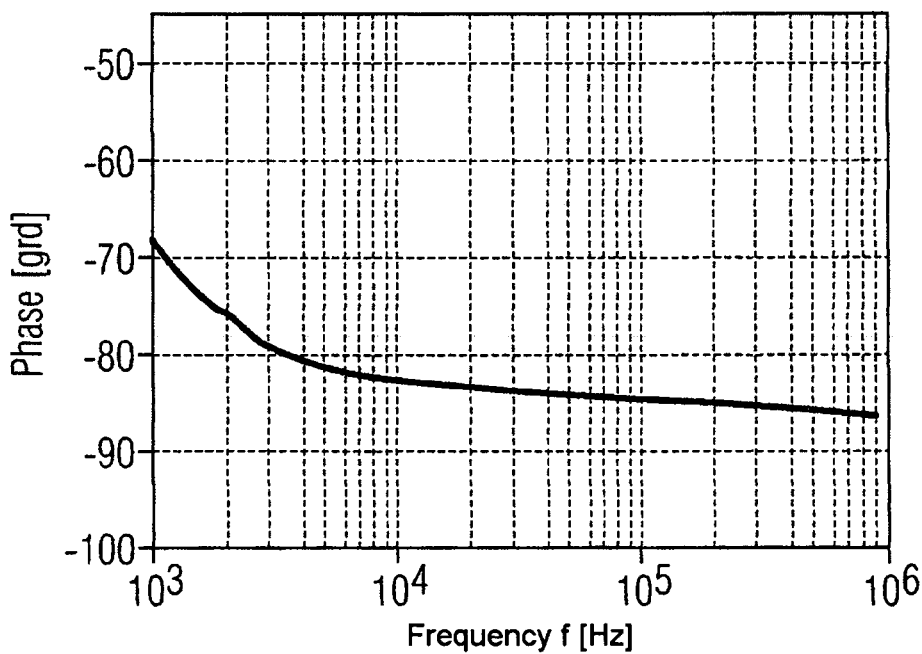
FIG. 20 shows the dependence of the phase on the frequency of capacitors with an integration density of 150 pF/mm$^2$
Figure 21:
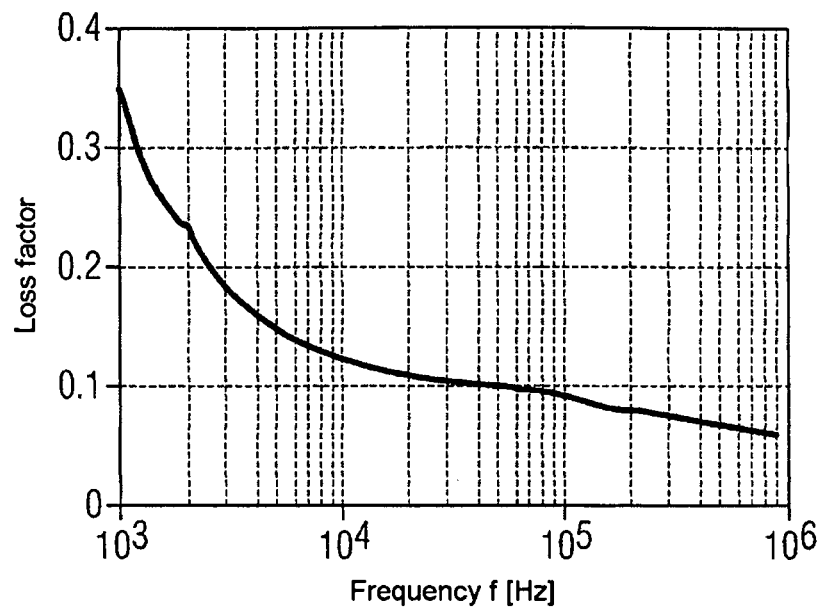
FIG. 21 shows the dependence of the loss factor on the frequency of capacitors with an integration density of 150 pF/mm$^2$
Figure 22:
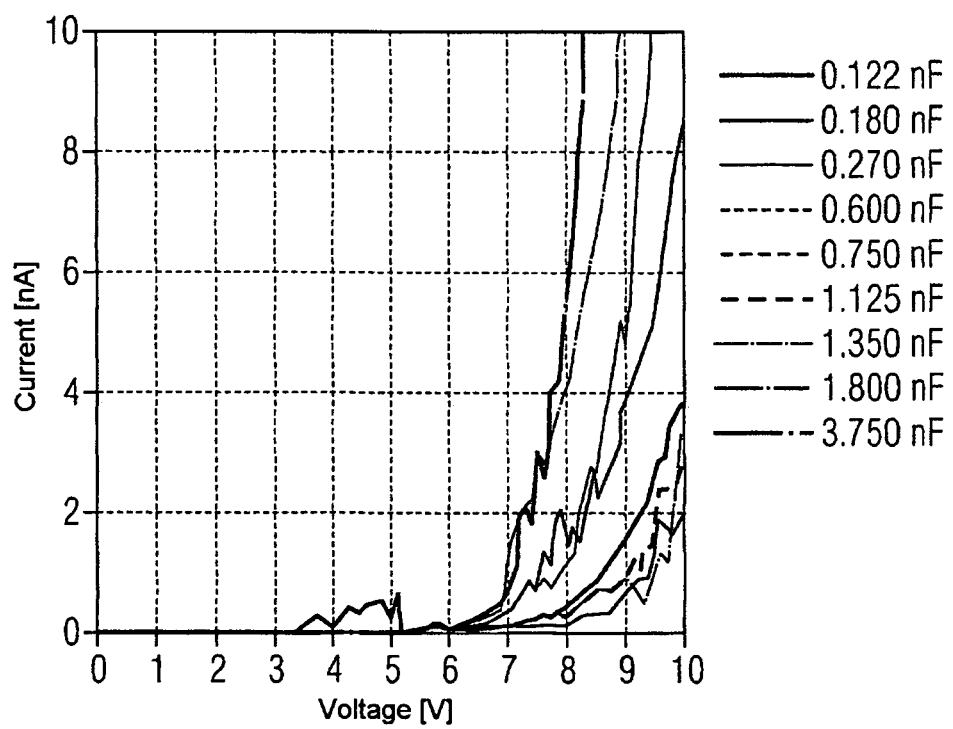
FIG. 22 shows the dependence of leakage current characteristics as a function of voltage for different capacitors
Figure 23:
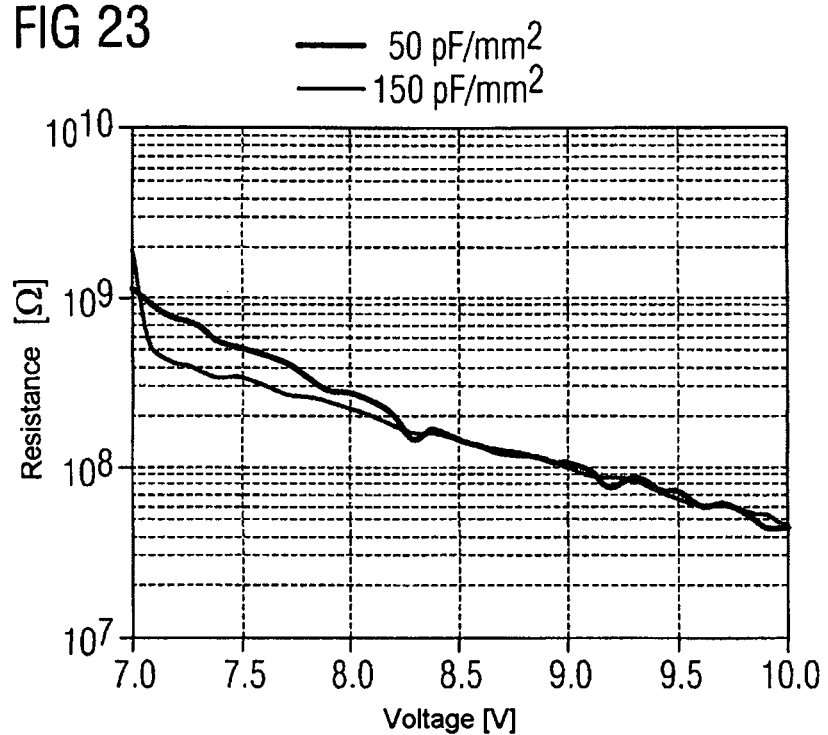
FIG. 23 shows the resistance of the capacitor to DC current at different integration densities.

The yield of functioning substrates was >>90% on a substrate analogous to example 1. FIG. 19 shows the essentially frequency-independent behavior of capacitance of a capacitor of area 1 mm$^2$. The loss factor was in the range of 0.05-0.3 and is, as shown in FIG. 21, likewise virtually independent of the frequency. FIG. 22 shows the leakage current measured for capacitors with different electrode areas. The measurement results are essentially independent of the capacitance value and hence of the electrode area. In addition, the currents measured are comparable to those in example 2, FIGS. 6 and 7. FIG. 23 shows the ohmic resistance measured in the equivalent circuit diagram of the real capacitors at different integration densities or at different effective mean polymer layer thicknesses (180-200 nm for 150 pF/mm$^2$ and 500-600 nm for 50 pF/mm$^2$). The resistance is the same in both cases.

FIG. 23 shows the resistance of the capacitor to DC current at different integration densities.

Figure 24:
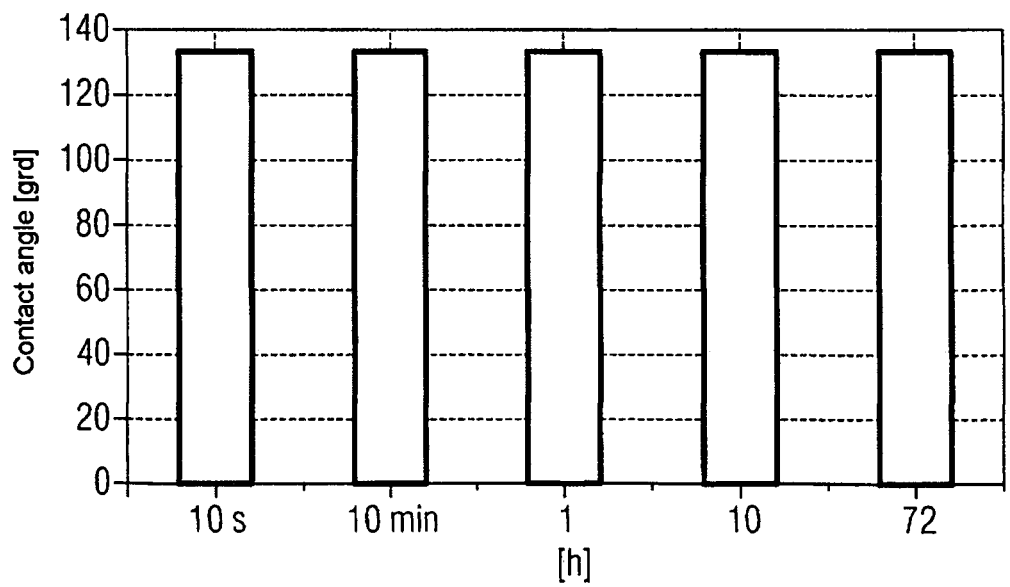
FIG. 24 shows the dependence of the contact angle measured after the SAM coating of the circuit board on the insertion time of the sample in the solution.

The fact that the resistances measured in FIG. 23 have the same profiles shows that the essential contribution to the ohmic overall resistance of the capacitor to direct current is made by the self-assembled monolayer. The quality of the SAM layer deposited is therefore paramount firstly for the good insulation properties and secondly for a good yield of the actual capacitors. FIG. 24 shows that the process has low dynamics. After an insertion time of 10 seconds, the contact angle is only 1.1° less than after 10 minutes, and 1.9° less than after one hour. The angle then remains, after repeated measurements, at a mean of 135°±0.8°, even after 72 hours of insertion time of the samples in the SAM solution.

FIG. 24 shows the dependence of the contact angle measured after the SAM coating of the circuit board on the insertion time of the sample in the solution.

In a further embodiment, the polymer layer is in the form of ABS (acrylonitrile-butadiene-styrene). This is structurally seeded with palladium by standard methods and the outer electrodes of copper or nickel are deposited electrolessly.

Here, capacitors which can be produced in a parallel process on a prepreg or other common circuit board substrates are described for the first time. Thereafter, the prefabricated capacitor layer can be integrated into the circuit board, which results in a space/cost saving for the surface of the circuit board.

The topography of the capacitor is extremely small in relation to the roughness of the base substrate. The related art assumes that it is not possible to deposit self-assembled monolayers on copper. It is shown here that self-assembled monolayers (SAMs) with phosphonic acid anchors can be deposited very efficiently and rapidly on copper after the copper surface has been cleaned appropriately. This layer constitutes the actual insulation layer of the capacitor. For mechanical stabilization, a thin polymer layer is applied to the SAM. The outer contact may take various forms.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide* v. *DIRECTV*, 69 USPQ2d 1865 (Fed. Cir. 2004).

The invention claimed is:

1. A self-assembled monolayer capacitor comprising:
 a copper or copper containing substrate;
 an organic compound having anchor group and a head group connected by a linker group, the anchor group attaching directly to the substrate to form the self-assembled monolayer thereon, the anchor group containing at least one of a phosphonic acid and a phosphonic acid derivative, the linker group containing a polyether chain;
 a thin polymer layer attached to the head group;
 an outer electrode formed on the thin polymer layer, wherein
 the anchor group is attached directly to the substrate without a non-copper oxide.

2. The self-assembled monolayer capacitor as claimed in claim 1, wherein the anchor group comprises a long-chain phosphonic acid.

3. The self-assembled monolayer capacitor as claimed in claim 1, wherein the anchor group comprises a decyl- to octadecylphosphonic acid.

4. A capacitor comprising:
 a copper or copper-containing substrate;
 an electrode; and
 an electrically insulating self-assembled monolayer, comprising an organic compound and positioned between the electrode and the substrate, the organic compound comprising an anchor group and a head group connected by a linker group, the head group serving for attachment to a next layer, the anchor group containing at least one of a phosphonic acid and a phosphonic acid derivative, which attaches directly to the substrate without a non-copper oxide.

5. The capacitor as claimed in claim 4, wherein the anchor group comprises a long-chain phosphonic acid.

6. The capacitor as claimed in claim 4, wherein the anchor group comprises a decyl- to octadecylphosphonic acid.

7. The capacitor as claimed in claim 4, wherein the anchor group comprises a phosphonic acid described by the general formula $CH_3-(CH_2)_n-PO(OH)_2$, where n=8-25.

8. The capacitor as claimed in claim 4, wherein the linker group is a polyether chain $(-O-CH_2-CH_2-O-)_m$ where m is from 1 to 20.

9. The capacitor as claimed in claim 4, wherein a thin polymer layer is attached to the head group as the next layer.

10. The capacitor as claimed in claim 9, wherein the polymer layer is comprises a polyhydroxystyrene.

11. The capacitor as claimed in claim 10, wherein the polyhydroxystyrene has a molar mass in the range from 500 to 15,000.

12. The capacitor as claimed in claim 10, wherein the polyhydroxystyrene has been cross-linked by melamine-co-formaldehyde.

13. The capacitor as claimed in claim 9, wherein the polymer layer comprises at least one polymer selected from the group consisting of an epoxide, an acrylate, a urethane and a carbonate.

14. The capacitor as claimed in claim 9, wherein the polymer layer has a layer thickness in the region of less than 1 μm.

15. The capacitor as claimed in claim 9, wherein the polymer layer comprises a polymer having a molar mass in the range from 1000 to 1,000,000.

16. A component which is based on organic electronics, comprising:
 a circuit board, a prepreg or a blank, wherein the blank, circuit board or prepreg serves as a substrate and has a copper or copper-containing surface; and
 an electrically insulating self-assembled monolayer, comprising an organic compound, the organic compound comprising an anchor group and a head group connected by a linker group, the head group serving for attachment to a next layer, the anchor group containing at least one of a phosphonic acid and a phosphonic acid derivative, which attaches directly to the copper or copper-containing surface of the substrate without a non-copper oxide.

17. The component as claimed in claim 16, further comprising a polymer layer attached to the head group as the next layer.

18. The component as claimed in claim 16, further comprising an outer electrode formed of copper or nickel.

19. The component as claimed in claim 16, wherein the anchor group comprises a long-chain phosphonic acid.

20. The component as claimed in claim 16, wherein the anchor group comprises a decyl- to octadecylphosphonic acid.

* * * * *